(12) United States Patent
Borean et al.

(10) Patent No.: US 8,967,081 B2
(45) Date of Patent: Mar. 3, 2015

(54) DEVICE AND PROCESS FOR CHEMICAL VAPOR PHASE TREATMENT

(75) Inventors: Christophe Borean, Le Touvet (FR); Jean-Luc Delcarri, Saint Ismier (FR)

(73) Assignee: Altatech Semiconductor, Montbonnot-Saint-Martin (FR)

( * ) Notice: Subject to any disclaimer, the term of this patent is extended or adjusted under 35 U.S.C. 154(b) by 0 days.

(21) Appl. No.: 12/990,143

(22) PCT Filed: Apr. 22, 2009

(86) PCT No.: PCT/FR2009/000479
§ 371 (c)(1),
(2), (4) Date: Jan. 24, 2011

(87) PCT Pub. No.: WO2009/136019
PCT Pub. Date: Nov. 12, 2009

(65) Prior Publication Data
US 2011/0143551 A1  Jun. 16, 2011

(30) Foreign Application Priority Data
Apr. 28, 2008 (FR) .................................. 08 02375

(51) Int. Cl.
| | | |
|---|---|---|
| *C23C 16/455* | (2006.01) |
| *C23C 16/50* | (2006.01) |
| *C23C 16/503* | (2006.01) |
| *C23C 16/505* | (2006.01) |
| *C23C 16/509* | (2006.01) |
| *C23F 1/00* | (2006.01) |
| *H01L 21/306* | (2006.01) |
| *C23C 16/22* | (2006.01) |
| *C23C 16/06* | (2006.01) |

(52) U.S. Cl.
CPC ....... *C23C 16/45565* (2013.01); *C23C 16/4557* (2013.01); *C23C 16/45574* (2013.01)
USPC ................. 118/723 E; 118/723 ER; 118/724; 156/345.43; 156/345.47; 156/345.37

(58) Field of Classification Search
USPC ........... 118/723 E, 723 ER, 724; 156/345.43, 156/345.44, 345.45, 345.46, 345.47, 345.37
See application file for complete search history.

(56) References Cited

U.S. PATENT DOCUMENTS

| | | | | |
|---|---|---|---|---|
| 4,100,879 A | * | 7/1978 | Goldin et al. ................. 118/725 |
| 4,612,077 A | * | 9/1986 | Tracy et al. ............... 156/345.34 |
| 5,052,339 A | * | 10/1991 | Vakerlis et al. ........... 118/723 E |
| 5,366,585 A | * | 11/1994 | Robertson et al. .............. 216/67 |
| 5,423,918 A | * | 6/1995 | Gupta et al. ...................... 134/1 |
| 5,720,818 A | * | 2/1998 | Donde et al. ................. 118/500 |

(Continued)

*Primary Examiner* — Rudy Zervigon
(74) *Attorney, Agent, or Firm* — Meyertons, Hood, Kivlin, Kowert & Goetzel, P.C.; Eric B. Meyertons (57) ABSTRACT

Device for treating substrates, comprising a changer having controlled pressure and temperature, a substrate support which is provided in the chamber, the chamber comprising a gas inlet for carrying out a vapor phase deposition, and an upper wall of the chamber provided with a plurality of first channels connected to a first inlet and a plurality of second channels connected to a second inlet, the first and second channels opening into the chamber and being regularly distributed in the upper wall, a heating element provided above the upper wall and a gas discharge ring provided between the upper wall and the substrate support, the upper wall begin electrically conductive and insulated relative to the substrate support so as to be able to apply a voltage between the upper wall and the substrate support.

14 Claims, 4 Drawing Sheets

(56) References Cited

U.S. PATENT DOCUMENTS

| | | | |
|---|---|---|---|
| 5,838,121 A * | 11/1998 | Fairbairn et al. | 318/45 |
| 5,844,195 A * | 12/1998 | Fairbairn et al. | 219/121.43 |
| 5,855,681 A * | 1/1999 | Maydan et al. | 118/719 |
| 5,871,586 A * | 2/1999 | Crawley et al. | 118/715 |
| 5,884,009 A * | 3/1999 | Okase | 392/418 |
| 5,902,088 A * | 5/1999 | Fairbairn et al. | 414/217 |
| 5,904,799 A * | 5/1999 | Donohoe | 156/345.54 |
| 5,905,302 A * | 5/1999 | Lane et al. | 257/678 |
| 5,909,994 A * | 6/1999 | Blum et al. | 414/217 |
| 5,911,834 A * | 6/1999 | Fairbairn et al. | 134/1.3 |
| 5,933,314 A * | 8/1999 | Lambson et al. | 361/234 |
| 5,935,337 A * | 8/1999 | Takeuchi et al. | 118/724 |
| 5,948,224 A * | 9/1999 | Signer et al. | 204/298.08 |
| 5,950,925 A * | 9/1999 | Fukunaga et al. | 239/132.3 |
| 6,022,446 A * | 2/2000 | Shan et al. | 156/345.46 |
| 6,024,044 A * | 2/2000 | Law et al. | 118/723 E |
| 6,077,157 A * | 6/2000 | Fairbairn et al. | 454/49 |
| 6,082,950 A * | 7/2000 | Altwood et al. | 414/217 |
| 6,101,969 A * | 8/2000 | Niori et al. | 118/723 E |
| 6,132,512 A * | 10/2000 | Horie et al. | 118/715 |
| 6,152,070 A * | 11/2000 | Fairbairn et al. | 118/719 |
| 6,203,620 B1 * | 3/2001 | Moslehi | 156/345.3 |
| 6,209,480 B1 * | 4/2001 | Moslehi | 118/723 I |
| 6,224,312 B1 * | 5/2001 | Sundar | 414/217 |
| 6,245,202 B1 * | 6/2001 | Edamura et al. | 204/298.06 |
| 6,258,170 B1 * | 7/2001 | Somekh et al. | 118/715 |
| 6,286,454 B1 * | 9/2001 | Hirayama et al. | 118/723 MW |
| 6,290,806 B1 * | 9/2001 | Donohoe | 156/345.3 |
| 6,308,654 B1 * | 10/2001 | Schneider et al. | 118/723 I |
| 6,352,593 B1 * | 3/2002 | Brors et al. | 118/724 |
| 6,413,321 B1 * | 7/2002 | Kim et al. | 118/725 |
| 6,413,358 B2 * | 7/2002 | Donohoe | 156/345.51 |
| 6,450,803 B2 * | 9/2002 | Shirakawa et al. | 432/77 |
| 6,471,830 B1 * | 10/2002 | Moslehi et al. | 204/192.12 |
| 6,500,300 B2 * | 12/2002 | Donohoe | 156/345.35 |
| 6,559,070 B1 * | 5/2003 | Mandal | 438/781 |
| 6,582,522 B2 * | 6/2003 | Luo et al. | 118/715 |
| 6,586,343 B1 * | 7/2003 | Ho et al. | 438/758 |
| 6,635,114 B2 * | 10/2003 | Zhao et al. | 118/715 |
| 6,635,115 B1 * | 10/2003 | Fairbairn et al. | 118/719 |
| 6,663,714 B2 * | 12/2003 | Mizuno et al. | 118/719 |
| 6,676,761 B2 * | 1/2004 | Shang et al. | 118/728 |
| 6,838,393 B2 * | 1/2005 | Yim et al. | 438/769 |
| 6,849,241 B2 * | 2/2005 | Dauelsberg et al. | 423/328.2 |
| 6,890,850 B2 * | 5/2005 | Lee et al. | 438/631 |
| 6,946,053 B2 * | 9/2005 | Donohoe | 156/345.44 |
| 7,083,702 B2 * | 8/2006 | Blonigan et al. | 156/345.47 |
| 7,115,184 B2 * | 10/2006 | Ohmi et al. | 156/345.33 |
| 7,201,942 B2 * | 4/2007 | Jurgensen et al. | 427/248.1 |
| 7,267,725 B2 * | 9/2007 | Kawano | 118/719 |
| 7,276,123 B2 * | 10/2007 | Shimizu et al. | 118/719 |
| RE40,052 E * | 2/2008 | Shirakawa et al. | 219/390 |
| 7,520,244 B2 * | 4/2009 | Yamagishi et al. | 118/723 E |
| 7,565,879 B2 * | 7/2009 | Kanai et al. | 118/723 MW |
| 7,628,863 B2 * | 12/2009 | Sen et al. | 118/715 |
| 7,655,092 B2 * | 2/2010 | Fairbairn et al. | 118/719 |
| 7,661,386 B2 * | 2/2010 | Kasai et al. | 118/666 |
| 7,670,454 B2 * | 3/2010 | Ohmi et al. | 156/345.41 |
| 7,670,646 B2 * | 3/2010 | Ahn et al. | 427/255.32 |
| 7,712,434 B2 * | 5/2010 | Dhindsa et al. | 118/723 E |
| 7,802,539 B2 * | 9/2010 | Bosch | 118/723 E |
| 7,955,986 B2 * | 6/2011 | Hoffman et al. | 438/714 |
| 8,115,140 B2 * | 2/2012 | Launsby et al. | 219/390 |
| 8,128,751 B2 * | 3/2012 | Kasai et al. | 118/715 |
| 8,133,323 B2 * | 3/2012 | Kakegawa | 118/724 |
| 8,361,892 B2 * | 1/2013 | Tam et al. | 438/507 |
| 8,506,713 B2 * | 8/2013 | Takagi | 118/715 |
| 2001/0016157 A1 * | 8/2001 | Sundar | 414/217 |
| 2001/0047760 A1 * | 12/2001 | Moslehi | 118/723 I |
| 2002/0000198 A1 * | 1/2002 | Ishikawa et al. | 118/715 |
| 2003/0051665 A1 * | 3/2003 | Zhao et al. | 118/723 E |
| 2003/0168008 A1 * | 9/2003 | Ohmi et al. | 118/715 |
| 2003/0178144 A1 * | 9/2003 | Ohmi et al. | 156/345.41 |
| 2004/0020601 A1 * | 2/2004 | Zhao et al. | 156/345.32 |
| 2004/0050494 A1 * | 3/2004 | Ohmi et al. | 156/345.41 |
| 2004/0069225 A1 * | 4/2004 | Fairbairn et al. | 118/715 |
| 2004/0094094 A1 * | 5/2004 | Ohmi et al. | 118/723 MW |
| 2004/0250955 A1 * | 12/2004 | Blonigan et al. | 156/345.51 |
| 2005/0000423 A1 * | 1/2005 | Kasai et al. | 118/715 |
| 2005/0003600 A1 * | 1/2005 | Kasai et al. | 438/200 |
| 2005/0022737 A1 * | 2/2005 | Shimizu et al. | 118/715 |
| 2005/0109276 A1 * | 5/2005 | Iyer et al. | 118/715 |
| 2005/0211265 A1 * | 9/2005 | Zheng et al. | 134/1.1 |
| 2006/0093756 A1 * | 5/2006 | Rajagopalan et al. | 427/569 |
| 2006/0096541 A1 * | 5/2006 | Seo et al. | 118/724 |
| 2006/0225649 A1 * | 10/2006 | Courville | 118/715 |
| 2006/0278166 A1 * | 12/2006 | Yamoto et al. | 118/726 |
| 2007/0084406 A1 * | 4/2007 | Yudovsky et al. | 118/724 |
| 2007/0128861 A1 * | 6/2007 | Kim et al. | 438/680 |
| 2008/0241377 A1 * | 10/2008 | Faguet | 427/248.1 |
| 2009/0095218 A1 * | 4/2009 | Meinhold et al. | 118/708 |
| 2009/0095221 A1 * | 4/2009 | Tam et al. | 118/715 |
| 2009/0095222 A1 * | 4/2009 | Tam et al. | 118/723 R |
| 2009/0151639 A1 * | 6/2009 | Kasai et al. | 118/724 |
| 2010/0024981 A1 * | 2/2010 | Wallace et al. | 156/345.27 |
| 2010/0024982 A1 * | 2/2010 | Wallace et al. | 156/345.27 |
| 2010/0025368 A1 * | 2/2010 | Hamelin et al. | 216/59 |
| 2012/0305191 A1 * | 12/2012 | Mun et al. | 156/345.44 |

\* cited by examiner

DEVICE AND PROCESS FOR CHEMICAL VAPOR PHASE TREATMENT

BACKGROUND

1. Field of the Invention

The invention relates to the field of production of integrated circuits or microsystems and, more particularly, equipment for chemical vapour deposition.

2. Description of the Relevant Art

Integrated circuits or microsystems are produced from wafers or substrates which are generally composed of silicon or another semiconductor material and which are subjected to a succession of steps for depositing thin layers of various materials, masking and lithography of those layers then engraving of those layers. Between those steps for producing active elements of the devices there are interposed steps for cleaning the surfaces and inspection steps, in which the quality of the production methods is examined.

The present invention particularly relates to equipment for depositing layers which constitute integrated circuits and microsystems and, more particularly, equipment for chemical vapour deposition.

Various types of deposition are used in the technologies for producing integrated circuits and microsystems: so-called physical depositions (atomisation, evaporation) and so-called chemical depositions: chemical vapour deposition, atomic layer deposition, electrochemical deposition, to set out merely the main categories which are themselves subdivided into a plurality of sub-categories.

Physical depositions which more particularly involve the deposit of metal layers are carried out in pressure ranges of from a few nanobar to a few microbar. They have the advantage of being relatively simple to carry out because they use only neutral gases in order to carry out the depositions. Owing to their directional nature, however, they have the disadvantage of not uniformly covering patterns which have horizontal surfaces and vertical or quasi-vertical surfaces, such as the ones which appear in the production of integrated circuits and microsystems.

The rate of coverage of a surface by a physical deposit is directly proportional to the solid angle when viewed from that surface. As a result, the projecting portions and the horizontal surfaces of a pattern are covered with a thickness greater than the reflex angles or the vertical surfaces. Therefore, there results inhomogeneity of the deposits which may impair the correct operation of the electronic device produced.

In chemical depositions, there is brought about adsorption, chemical sorption or a heterogeneous reaction at the surface of the substrate to be covered. That adsorption, chemical sorption or reaction occurs at all the surfaces if adequate conditions involving temperature, pressure and the concentration of the reagents are combined in the case of a vapour phase deposition. As a result, the chemical depositions and particularly the chemical vapour depositions intrinsically cover in a uniform manner the surface of the patterns constituting the integrated circuits or microsystems. That characteristic is particularly advantageous in recent circuits or microsystems where the patterns to be covered may have very high form factors (relationship between the width and the height of the pattern).

The systems for producing integrated circuits or microsystems generally comprise a treatment chamber comprising a support for the substrate in the chamber.

A gas distribution assembly, also referred to using the term "showerhead", provides one or more treatment gases near the substrate. The gases may be used to form a plasma. Such methods may comprise chemical vapour deposition (CVD), plasma enhanced chemical vapour deposition (PECVD) to deposit a layer on the substrate or an engraving reaction to remove material from the wafer.

In this regard, there are known documents U.S. Pat. No. 5,292,554, and U.S. Pat. No. 5,516,367, which have been adapted to old production technologies, International Patent Application Publication No. WO03/060185 and U.S. Patent Publication No. 2006/21703.

The Applicant became aware that known treatment chambers were liable to allow the occurrence of interference reactions between several gases upstream of the gas distribution assembly. Such interference reactions may deposit solids of powder-like form at undesirable locations. Furthermore, since the pressure upstream of the gas distribution assembly is higher than at the surface of the substrate to be covered, such interference reactions in the gas state are promoted.

Furthermore, the Applicant identified that the most recent materials whose use is envisaged in the field of integrated circuits and microsystems may involve the risk of the holes of the gas distribution assembly becoming clogged.

The invention is intended to improve the situation.

SUMMARY

The device for treating substrates comprises a chamber having controlled pressure and temperature and a substrate support. The support is provided in the chamber. The chamber comprises a plurality of gas inlets, for example, two. The device comprises a plurality of first channels which are connected to a first gas inlet and a plurality of second channels which are connected to a second gas inlet. The first and second channels open in the chamber. They are regularly distributed in the upper wall of the chamber. The device also comprises a heating element which is capable of heating the upper wall and a gas discharge ring which is provided between the upper wall and the substrate support. The upper wall is electrically conductive and insulated relative to the wafer support of the chamber so as to be able to apply a voltage between the upper wall and the wafer support.

The invention also relates to a process for treating substrates in a chamber with controlled temperature and pressure, a substrate being supported by a support which is provided in the chamber. Gas inlets are heated to a temperature higher than a condensation temperature, it being possible to carry out the heating using a heat-exchange fluid. Gases are introduced via the inlets, the gases being introduced through an upper wall of the chamber provided under the inlets, the introduction being effected via different holes in accordance with the type of gas and extending into the chamber, the holes being regularly distributed. If it is desirable to generate a plasma, a high-frequency electrical voltage is applied to the upper wall in relation to the support.

The chamber may form a vessel whose pressure is adjusted below atmospheric pressure by means of a pumping system, on the one hand, and a pressure control system on the other.

The heating element, in particular involving a heat-exchange fluid, allows heating of the gases to a suitable temperature in the inlets, for example, a temperature allowing condensation phenomena to be limited, taking into account the fact that the pressure of the gases in the inlets is slightly greater than the pressure of the gases in the chamber. The heating element may be provided above or inside the upper wall.

The heating element, in particular involving a heat-exchange fluid, also allows a voltage to be applied so as to generate a plasma, with the generation of interference being prevented, which would not be the case with heating of the electrical resistance type. Alternatively, an infrared lamp may be used to bring about the remote heating of the cover. An insulated resistor may also be used and mounted in an insulating casing, particularly composed of ceramic material.

Furthermore, a voltage being applied between the upper wall and the support in order to generate a plasma between those two elements allows the chamber to be efficiently cleaned in situ by introducing gases which are selected to react with the deposits which may be present inside the chamber. The cleaning gases are selected so that the products of the reaction of those gases with the deposits are volatile and can thereby be discharged by pumping. The treatment device and process are very suitable for the deposit of materials for producing microelectronic and micro-electromechanical devices, such as, by way of non-limiting example: $HfO_2$, $ZrO_2$, Ru, Pt, Ir and Ir and $IrO_2$, alone or in admixture. Those materials are often prepared from powdered organometallic precursors which are placed in a liquid solution in a suitable solvent, then evaporated. With such gases from solutions of solid compounds having an evaporation temperature that is different from that of the solvent, the risk of a conventional installation becoming clogged is relatively high owing to either condensation or decomposition of the solid product.

BRIEF DESCRIPTION OF THE DRAWINGS

The present invention will be better understood from a reading of the detailed description of several embodiments which are set out by way of non-limiting example and illustrated with reference to the appended drawings, in which.

In the 1990s, vacuum chambers were used for chemical vapour deposition with electrical heating elements, a reactive gas inlet and a purging gas supply.

DETAILED DESCRIPTION

Subsequently, attempts were made to limit the effects of the reactive gases on the walls of the chamber by providing an anti-corrosion layer of refractory material which is resistant to chemical attack by the gases in order to conserve the reflective properties of the internal wall of the reaction chamber.

More recently, attempts were made to introduce two reactive gases into a treatment chamber by means of a gas distribution assembly of brazed nickel.

However, the Applicant became aware of a problem which had not currently been identified, that of clogging of the upper wall owing to deposits of powder-like materials. The powder-like materials may be from reactive gases which are capable of carrying such materials, or from a reaction between reactive gases, condensation of reactive gases, etc.

Furthermore, the Applicant realised that it was important to promote the regularity of gas flow lines in the chamber in order to obtain a deposit having a homogeneous thickness over the entire surface of the substrate.

For a general description of a treatment chamber, reference may be made to documents WO03/060185 and US2006/21703.

The heating element using a heat-exchange fluid prevents occurrences of electrical interference during the generation of a plasma by the upper wall being placed under voltage at a selected frequency. The heating element may be provided on the upper wall or on an inserted component in order to heat the upper wall and the gas inlets.

The device may comprise at least one high-frequency generator (56) which is provided with an outlet which is connected to the upper wall. The earth of the high-frequency generator may be connected to the substrate support. The heating element may be electrically inactive. The upper wall is insulated relative to the wafer support and the side walls of the chamber so as to be able to apply a voltage between the upper wall and the wafer support.

The substrate support may comprise at least one heating element in order to heat the substrate and a conductor which can be connected to earth. It is thereby possible to control the temperature profile of the substrate support.

The number of channels of the upper wall of the chamber is greater than 500, for example, in the order of 700 for a substrate to be treated having a diameter of 200 mm.

The first inlet of the upper wall of the chamber is connected to a first source of gas and the second inlet is connected to a second source of gas.

The first inlet of the upper wall may be connected to a gas source and the second inlet may be connected to an evaporator.

A cover may comprise a conductive body, an upper chamber wall (30) which brings about the distribution of the gases, a heating element and insulation with respect to the substrate support. The insulation may be provided in the form of a ring in contact with a chamber body. The heating element is protected against RF interference. The protection may be intrinsic, for example, with thermal conduction, for example, brought about by an electrically insulating heat-exchange fluid, or radiation, for example, infrared radiation, remote bringing about decoupling, or structural, for example, an insulation housing which withstands heat and in which a resistor is provided. In the case of a heat-exchange fluid, the energy may be provided by a remote electrical resistor which is only slightly subjected to RF radiation.

The upper wall may comprise a plurality of pins forming the first channels. The pins may be force-fitted in the upper wall. Excellent sealing is obtained.

The gas discharge ring or pumping ring may comprise at least a portion of electrically insulating material. The ring may be constructed in one piece. The ring may comprise an upper portion based on a ceramic material or coated with a ceramic material and a lower portion. The lower portion may be electrically conductive. The lower portion may be constructed on the basis of a light alloy.

The gas discharge ring may comprise at least ten openings which are in communication with the chamber and which are distributed over the circumference of the ring so that the vector range of the gas discharge rate has axial symmetry with respect to the vertical axis of the chamber and the flow of the gases is of a laminar type in the envisaged flow range. The gas discharge ring, the upper wall of the chamber and the heating element may be parallel.

The device may comprise an insulation component between the upper wall and a chamber body.

In the embodiment illustrated in the Figures, the treatment device which is generally designated 1 comprises a body 2 which defines a recess in a face and a cover 3 which closes the recess at that face in order to form a chamber 4. There is provided in the chamber 4 a support 5 which is provided with an upper surface 5a which is intended to support a substrate to be treated, for example, by deposition. The support 5 may comprise a base 6 and a plate 7. The base 6 may project through an opening 2a of the body 2 at the side opposite the cover 3. The base 6 may extend away from the plate 7 (in a manner not illustrated) and may be provided with means for movement, in terms of rotation and/or translation. The support 5 is composed of an insulating material which contains an electrode, for example, based on AlN as the insulation and Mo for the electrode. The support 5 may be provided with a thermal control member 55, for example, of the type described in document EP0619381, to which the reader may wish to refer. The member 55 may be heating and/or cooling.

The cover 3 comprises a plurality of elements of generally circular form. The elements of the cover 3 may be arranged so as to be substantially parallel with each other. The cover 3 may carry out functions involving sealing, introducing a plurality of gases, heating the gases and the electrode in order to be able to generate an electrical field in the chamber 4. The cover 3 comprises a lower portion 9 and a main portion 10.

The cover 3 rests on an upper edge of the body 2. More specifically, the lower portion 9 of the cover 3 is generally in the form of a flat disk resting on an upper surface of the main portion 8, forming the upper portion of the body 2. The main portion 8 may be constructed based on a light alloy. The lower portion 9 of the cover 3 may be constructed based on a light alloy, for example, the same alloy.

The generally circular main portion 10 rests on the lower portion 9. The main portion 10 may be constructed from a light alloy. The main portion 10 is thermally conductive and is perforated with a central hole which forms a first inlet 11 for a first gas and an oblique hole which is provided near an outer edge of the main portion 10 and which forms a second inlet 12 for a second gas.

The main portion 10 comprises a circular concavity 13 which is provided from the main surface thereof opposite the chamber 4. A heating element 14 is arranged in the recess 13 and comprises a lower portion 15 which is provided at the bottom of the recess 13 and an upper portion 16. The lower portion 15 and the upper portion 16 can be fixed together by screws 17. The lower portion 15 and upper portion 16 are in the form of a disk having a central hole.

A projection 10a of the main portion 10 projects from the bottom of the recess 13 in the direction away from the chamber 4, extending in the central hole of the lower portion 15 and upper portion 16. The projection 10a is recessed relative to the upper surface of the upper portion 16. The inlet 11 for the first gas is arranged in the central projection 10a.

There is provided, above the central projection 10a, an electrically and thermally insulating washer 18, for example, of a ceramic material, between the main portion 10 and the elements provided upstream in the direction of flow of the first gas. A connector 19 brings about the connection between the washer 18 and a conduit 20 for supplying the first gas. The connector 19 can be screwed to the washer 18. Sealing joints, for example, circular joints, may be provided between the washer 18 and the projection 10a, on the one hand, and between the connector 19 and the washer 18 on the other.

Figures 6, 7, 8:
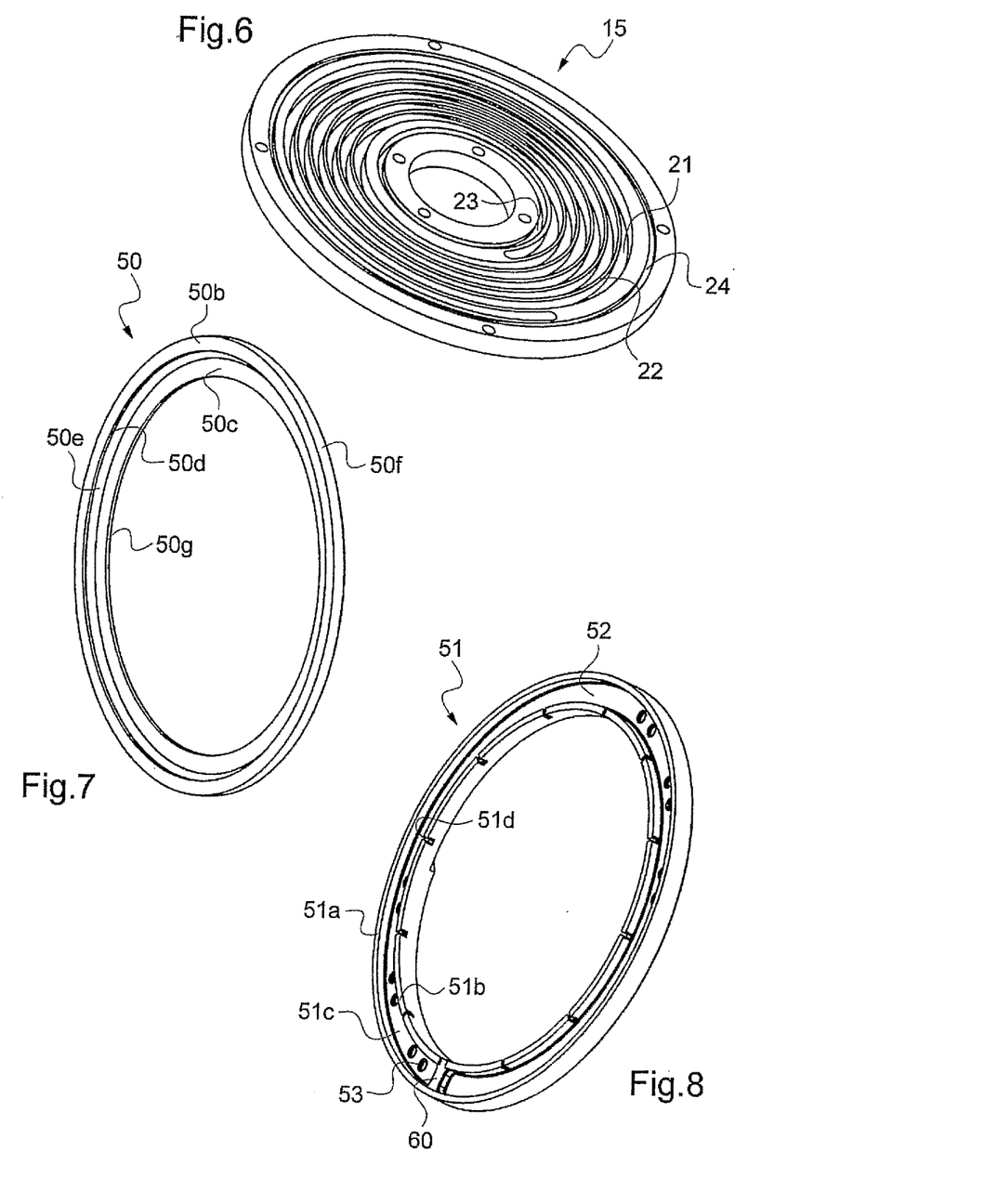
FIG. 6 is a perspective view of part of the heating element.
FIG. 7 is a perspective view of the cover of the pumping ring.
FIG. 8 is a perspective view of the gas pumping ring.

As can be seen in greater detail in FIG. 6, the lower portion 15 of the heating element 14 has a spiral channel 21 which has a substantially rectangular cross-section and which is formed over a plurality of turns between an end having a small diameter and an end having a large diameter. The channel 21 allows a heat-exchange fluid to flow at a temperature, for example, between 50° and 300°. The heat-exchange fluid may comprise a silicone oil or a perfluorinated compound. The turns of the spiral channel 21 are separated by a spiral wall 22 which has a radial thickness less than the radial dimension of the channel 21. The upper plate 16 is provided with an inlet and an outlet for heat-exchange fluid (not illustrated) which are connected at the ends. The lower portion 15 may be constructed from a thermally conductive material, for example, based on aluminium or copper. The upper portion 16 may be constructed from a material having a level of thermal conductivity less than that of the material of the lower portion 15, for example, a stainless steel, in particular of the type 316L.

Two annular grooves, one 23 having a small diameter and one 24 having a large diameter, are provided in the lower portion 15 and are open at the same side as the spiral channel 21. Sealing joints may be provided in the annular grooves 23 and 24, radially surrounding the spiral channel 21. Excellent sealing of the channel 21 which is closed by the upper portion 16 is thereby ensured.

Figure 2:
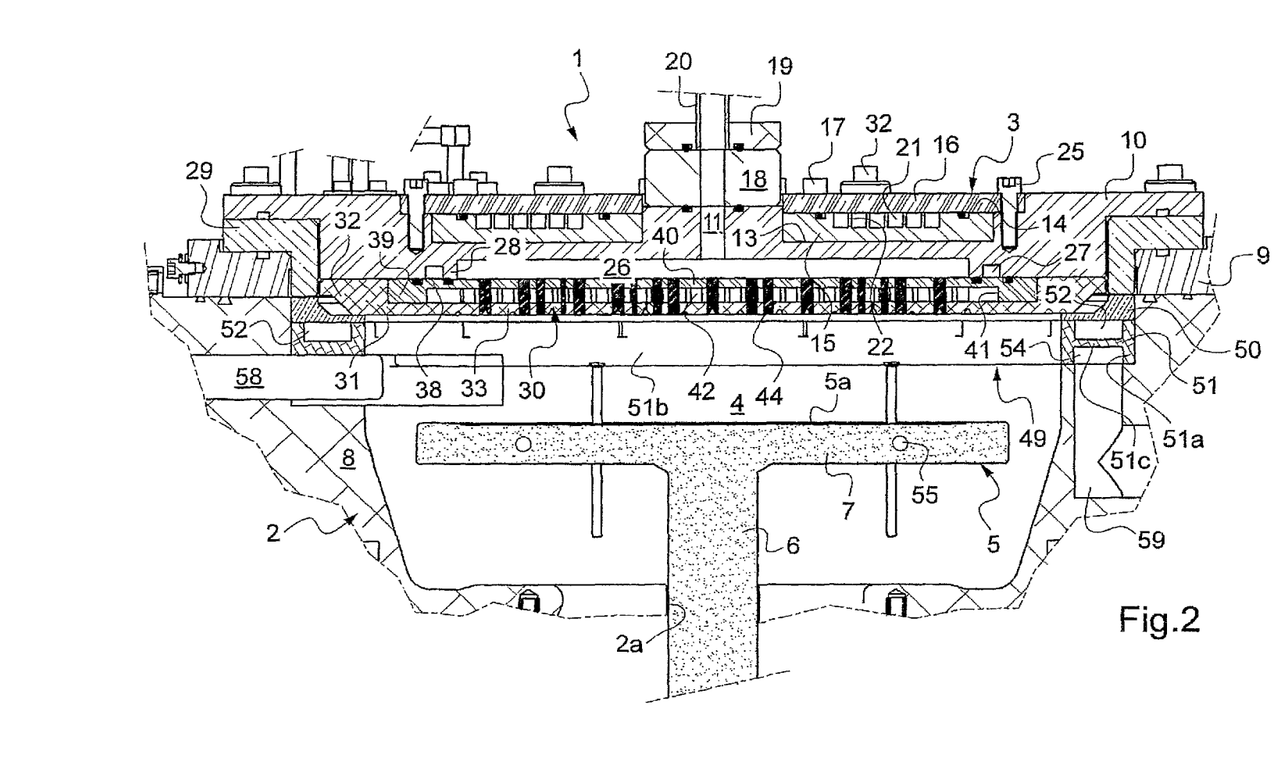

Screws 25 are provided to fix the upper portion 16 of the heating element 14 to the main portion 10 of the cover 3, see FIG. 2. The lower portion 15 is thereby secured between the bottom of the concavity 13 and the upper portion 16, ensuring the sealing of the spiral channel 21 between the lower portion 15 and the upper portion 16 of the heating element 14.

Starting from the surface of the main portion 10 of the cover 3, opposite the heating element 14, there is provided a concavity 26 which is centred relative to the axis of the cover 3 and which is in fluid communication with the inlet 11 of the first gas.

An annular groove 27 is further provided in the main portion 10 of the cover 3 from the surface opposite the heating element 14. The annular groove 27 is in fluid communication with the inlet 12 for the second gas. The annular groove 27 is separated from the central concavity 26 by an annular flange 28 which is part of the main portion 10, the central concavity 26 thereby being surrounded by the flange 28 and the groove 27.

The cover 3 also comprises an insulating ring 29 which is provided near the outer edge of the main portion 10. The ring 29 is electrically insulating, in particular with respect to the lower portion 9 of the cover 3. The insulating ring 29 has an L-like cross-section with an upper surface and a hole in contact with the main portion 10 of the cover 3, an outer surface having a large diameter in contact with the lower portion 9 of the cover 3. The hole is also in contact with an upper wall 30 of the chamber 4 described below. The insulating ring 29 has an annular lower wall which is in contact with a gas discharge ring 49 described below. The main portion 10 and the insulating ring 29 of the cover 3 may be fixed to the lower portion 9 by screws 32. The body 2 is separated from the main portion 10 and the wall 30 by the insulating ring 29. The insulating ring 29 may be based on a ceramic material of the type $Al_2O_3$.

Figure 3:
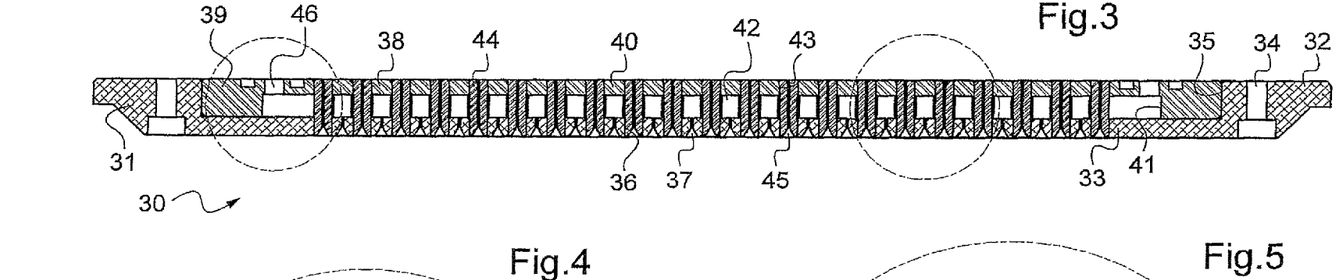
FIG. 3 is a detailed view of the upper wall of the treatment chamber of FIGS. 1 and 2.

The upper wall 30 is held between a lower surface of the main portion 10 of the cover 3 and the gas discharge ring 49. The upper wall 30 is visible in greater detail in FIGS. 3 to 5 and is of generally annular shape. The upper wall 30 comprises a body 31 which comprises an outer edge 32 and a central plate 33 having a thickness less than that of the outer edge 32. Holes 34 are provided in the outer edge 32, in particular in order to be fixed by screws which are not illustrated to the main portion 10 of the cover 3. The body 31 is in one piece. The body 31 comprises a light alloy which is thermally conductive.

Owing to the difference in thickness between the central plate 33 and the outer edge 32, a concavity 35 is formed at the side opposite the chamber 4. There are provided in the central plate 33 through-holes of at least two types. Holes 36 have a substantially constant cross-section. Holes 37 have a portion 37a having a small diameter in the region of the concavity 35 and a widened frustoconical portion 37b which is opposite the concavity 35 and which has a diameter which increases in the direction moving away from the concavity 35. The holes 36 and the holes 37 alternate, for example, being provided in the manner of a draughts-board, in a square or zigzag manner. There may be a large number of holes 36 and 37, for example, between 500 and 1500. The diameter of the holes 36 is greater than the diameter of the holes 37.

The upper wall 30 also comprises a counter-plate 38 which comprises an outer edge 39 and a central portion 40. The central portion 40 has a thickness less than the outer edge 39, thereby providing a concavity 41 which is orientated at the side of the central plate 33. The outer edge 39 of the counter-plate 38 is adjusted in the concavity 35 of the body 31, thereby forming a distribution chamber 42 between the central plate 33 and the counter-plate 38. The central portion 40 of the counter-plate 38 is perforated by a plurality of through-holes 43 which are aligned with the holes 36 of the plate 33. However, the central portion 40 is solid facing the holes 37 of the plate 33.

The upper wall 30 comprises a plurality of pins 44 having an axial length substantially equal to the thickness of the body 31. Each pin 44 is mounted in a hole 36 of the central plate 33 and in a hole 43 of the central portion 40. Each hole 36 and each hole 43 is provided with a pin 44. Otherwise, any remaining hole 36 or hole 43 may be provided with a plug which is not illustrated. The pin 44 is in the form of a solid component which is provided with an outer cylindrical surface generated by revolution, an upper surface which is substantially aligned with the upper surface of the body 31 and a through-hole 45.

The pin 44 is force-fitted in the hole 36 and in the hole 43, for example, by fixing. The fitting can be carried out using a press. In order to facilitate the fixing, the pin 43 may be provided with a slight chamfer at the lower end thereof in the region of the outer surface thereof. In a variant, the pin 44 is brazed to the plate 33 and the counter-plate 38. However, assembly by clamped fitting is preferred in order to conserve the geometrical dimensions of the body 31 and the counter-plate 38. Clamped fitting ensures excellent sealing. The through-hole 45 places, in fluid communication, the chamber 26 which is provided at the lower face of the main portion 10 of the cover 3 and the chamber 4, with sealing being maintained relative to the chamber 42. The pin 44 may be a solid component which is constructed from a metal alloy, for example, based on a light alloy, which is thermally conductive. The hole 45 comprises a cylindrical portion 45a which has a small diameter and which extends over the majority of the length of the pin 44 from the upper surface of the body 31 which opens in the chamber 26, and a frustoconical portion 45b which opens in the chamber 4. The cylindrical portion 45a of the hole 45 may have a diameter which is substantially equal to the diameter of the cylindrical portion 37a of the hole 37 which is provided in the central plate 33 of the body 31. In this instance, the term "substantially equal" is intended to be understood to be equal to within 10%, preferably to within 5%.

The frustoconical portion 45b of the hole 45 may have dimensions which are substantially equal to those of the frustoconical portion 37b of the hole 37.

In other words, the upper wall 30 comprises a plurality of holes 45 which form first communication channels between the inlet 11 for the first gas and the chamber 4 by means of the chamber 26. The chamber 26 brings about distribution of the flow of the first gas in the holes 45.

Figure 4:
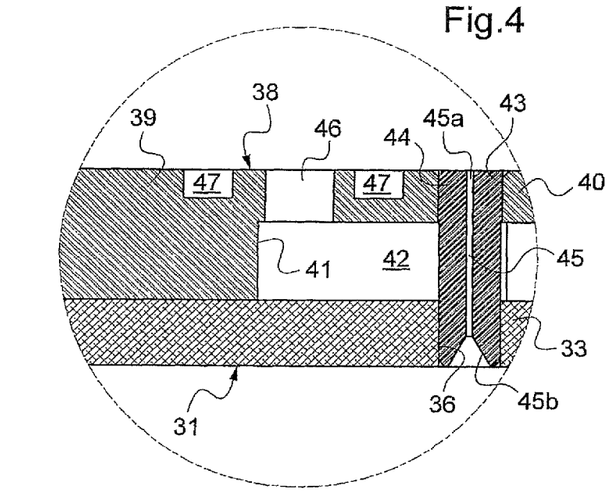
FIGS. 4 and 5 are detailed views of FIG. 3.
Figure 5:
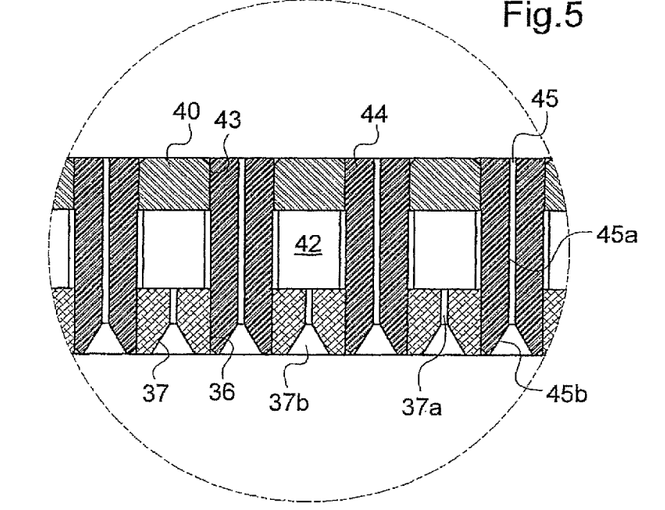

As can be seen more particularly in FIG. 4, the chamber 42 is provided with an inlet 46, in the region of the groove 27, in the form of a through-hole through the central portion 40 of the upper counter-plate 38 near the edge 39. Around the groove 27 there are provided two annular grooves 47 extending from the upper surface of the counter-plate 38 in order to receive therein two sealing joints 48. The sealing joints 48 are in contact with the lower surface of the main portion 10 of the cover 3. The hole 46 opens in the annular groove 27 which is provided from the lower surface of the main portion 10 of the cover 3 around the chamber 26, the groove 27 being in fluid communication with the inlet 12 for the second gas. FIG. 4 shows a single hole 46.

In order to promote the most homogeneous possible flow of the second gas, flowing from the inlet 12 into the groove 27, a plurality of holes 46 can be constructed through the central portion 40. The second gas passes through the hole(s) 46 and becomes dispersed in the chamber 42. The second gas then passes into the holes 37 which are constructed in the central plate 33 and is introduced into the treatment chamber 4. It is thereby possible to keep the first gas and second gas separate upstream of the chamber 4 in the direction of flow of the first and second gases. A chemical reaction is thereby prevented between some constituents of the first and second gases which may be detrimental to the step of treating the substrate or the treatment devices 1, in particular owing to clogging.

The heating element 14 allows the first and second gases, particularly at the inlets 11 and 12 into the chamber 26 and the groove 27, to be kept at a temperature sufficient to prevent condensation phenomena. Furthermore, the upper counter-plate 38 of the upper wall 30 can be constructed from a material which conducts heat well, for example, based on a light aluminium alloy, which also allows the counter-plate 38 to be maintained at a high temperature, owing to contact with the main portion 10 of the cover 3 and thermal conduction. The lower portion of the body 31 may also be constructed from a material having good thermal conduction, which allows the chamber 42 to be kept at a high temperature.

The gas discharge ring 49 is mounted on an annular surface 8a of the body 8 so as to be substantially parallel with the cover 3 and in a circular axial surface 8b forming a hole. The gas discharge ring 49 is also in contact with the insulating ring 29 and a lower surface of the body 31 of the upper wall 30. The gas discharge ring can be constructed in one piece or in several pieces. The ring 49 is arranged axially between the upper wall 30 and the support 5.

In the embodiment illustrated, the ring 49 comprises an upper portion 50 which is illustrated in FIG. 7 and a lower portion 51 which is illustrated in FIG. 8. The upper portion 50 is in the form of an annular component which comprises a lower planar surface 50a, an upper surface 50b which has a large diameter and is in contact with the insulating ring 29, and an upper surface 50c which has a small diameter and is in contact with the upper wall 30, the axial thickness of the upper portion 50 being greater in the region of the upper surface 50b having a large diameter than in the region of the upper surface 50c having a small diameter. A short axial surface 50d and a frustoconical surface 50e connect the surfaces 50b and 50c. The upper portion 50 also comprises an axial outer surface 50f in contact with the hole 8b of the body 8 and an internal surface 50g having a small axial dimension. The upper portion 50 can be constructed based on a ceramic material, of the $Al_2O_3$ type or a light alloy coated with ceramic material, of the type involving aluminium with a coating of the $Al_2O_3$ type. The upper portion 50 acts as a spacer between the insulating ring 29 and the lower portion 51 and as insulation between the main portion 10 of the cover 3 and the lower portion 51 of the ring 49.

The lower portion 51 is of generally annular form having an H-shaped cross-section. The lower portion 51 comprises an outer wall 51a, an inner wall 51b and a generally radial connecting wall 51c. The inner wall 51b has a plurality of notches 51d which place in communication the chamber 4, at the inner side of the inner wall 51b, and a generally annular channel 52 which is formed between the outer wall 51a, inner wall 51b, connecting wall 51c and the lower surface 50a of the upper portion 50. The notches 51d are regularly distributed circumferentially in order to allow discharge with gas intake which is sufficiently homogeneous, with axial symmetry and a laminar flow in the envisaged flow range. In that manner, gases are introduced via the holes 37, 45 of the upper wall 30, the holes being provided substantially at the centre of the chamber 4 and the gases are discharged via the notches 51d which are provided at the periphery of the chamber 4, which allows the fluid flow lines in the chamber 4 to be regulated.

Figure 1:
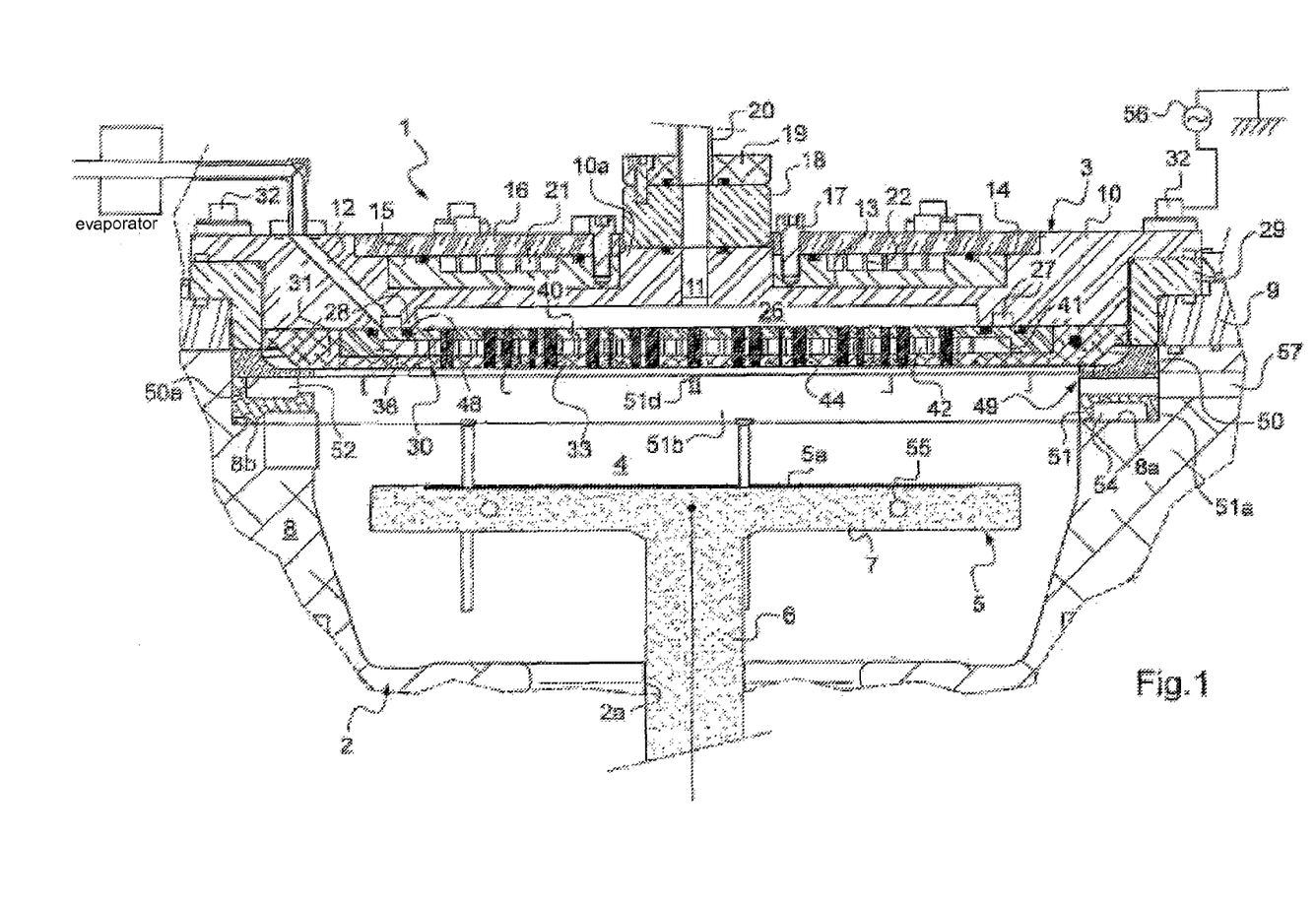
FIGS. 1 and 2 are axial sections in two intersecting planes of a treatment chamber.

The connecting wall 51c is perforated by a plurality of communication holes 53. The connecting wall 51c is provided substantially at half of the height of the outer wall 51a and inner wall 51b. A lower channel 54 is formed between the inner wall 51a and outer wall 51b, the connecting wall 51c and the annular surface 8a of the body 8. The holes 53 place the upper channel 52 and lower channel 54 in communication. The lower channel 54 is in communication with a gas discharge outlet 59 which is provided in the body 8, see FIG. 2. Furthermore, a hole 57 (see FIG. 1) is provided in the body 8 and in a boss 60 of substantially rectangular form projecting into the channel 52 from the connecting wall 51c (see FIG. 8) in order to allow viewing of the interior of the chamber when a plasma is produced in the chamber 4, for example, using an optical emission spectrometer. The hole 57 is closed at the outlet of the body 8 (not visible in FIG. 1) by anti-UV treated glass in order to ensure the sealing of the chamber 4 in this regard. An opening 58 is provided in the body 8 in order to allow the substrate to be moved to the centre of the chamber 4 on the support 5 via a vacuum transfer chamber, which may optionally be provided with a robot not illustrated in the Figures. That opening is constructed in such a manner that it does not impair the positioning of the gas discharge ring 49.

In one embodiment, the upper portion 50 of the gas discharge ring 49 is constructed from an electrically insulating material. The main portion 10 of the cover 3, the heating element 14 and the upper wall 30 of the chamber 4 are thereby electrically insulated with respect to the other elements of the treatment device 1 by the insulating washer 18, the insulating ring 29 and the upper portion 50 of the gas discharge ring. It is thereby possible to apply a selected voltage to the main portion 10 and the upper wall 30 using at least one high-frequency generator (56) to provide an alternating-current voltage at high frequency, whilst the support 5 is grounded.

The application of a high voltage allows polarisation promoting the production of a plasma in the chamber 4. The electrical connection between the cover 3 and a high-voltage supply via an impedance matching device may be carried out by a metal braid, for example, of copper, fixed by one of the screws 32.

The treatment device can thereby use temperatures suitable for the gases used for new generations of devices constructed on substrates, in particular vaporised solutions of solid precursors, or gases having a specific tendency towards condensation or the deposit of solid residues.

The heating element 14 involving a heat-exchange fluid flowing in the channel 21, which is inactive from an electrical point of view, is compatible with an electric voltage being applied to the cover 3. The heating element 14 allows the main portion 10 of the cover 3 to be kept at a temperature higher than the highest condensation temperature 1a of the gases introduced into the chamber 4, which allows a reduction in the risk of condensation or deposition. The application of an electric voltage may be used to generate a plasma which activates the chemical deposition reaction and may also serve to carry out cleaning in situ of the walls of the chamber. Occurrences of interference between the electrical supply and the heating element 14 are prevented by heating with heat-exchange fluid. Furthermore, the deposition temperature may be controlled by the heating member 55 which is mounted in the plate 7 of the support 5. The heating member 55 allows the substrate to be kept at a selected temperature, and also the gases in the chamber 4 to be kept at a selected temperature. It is possible to introduce at least two reactive gases, one per inlet, into the chamber simultaneously.

The invention claimed is:

1. Device for treating substrates, comprising:
a chamber having controlled pressure and temperature,
a substrate support which is provided in the chamber,
wherein the chamber comprises:
a first gas inlet and an upper chamber wall which is provided with a plurality of first holes which are coupled to the first gas inlet and a plurality of second holes which are coupled to a second gas inlet, the first holes and the second holes opening in the chamber and being regularly distributed in the upper chamber wall,
a heating element which is capable of heating the upper chamber wall and
a gas discharge ring which is provided between the upper chamber wall and the substrate support, said heating element having a lower portion comprising a spiral channel, the upper chamber wall being electrically conductive and insulated relative to the substrate support so as to be able to apply a voltage between the upper chamber wall and the substrate support;
wherein the heating element is provided above the upper chamber wall in order to heat the upper chamber wall and the inlets;
wherein the device comprises a body which defines a recess in a face and a cover which closes the recess at that face in order to form said chamber, wherein the cover comprises a main portion, wherein the upper chamber wall is held between the main portion of the cover and said gas discharge ring, wherein said main portion of the cover comprises a circular concavity which is provided from the main surface thereof opposite the chamber, and wherein said heating element is arranged in said circular concavity.

2. Device according to claim 1, wherein at least one of the inlets is connected upstream to an evaporator.

3. Device according to claim 1, comprising at least one high-frequency generator which comprises an outlet connected to the upper chamber wall.

4. Device according to claim 1, wherein the support of the substrate comprises at least one element with controlled temperature in order to control the temperature of the substrate.

5. Device according to claim 1, wherein the upper chamber wall comprises a plurality of pins which form the first channels.

6. Device according to claim 5, wherein the pins are force-fitted in the upper chamber wall.

7. Device according to claim 1, wherein the gas discharge ring comprises at least a portion of electrically insulating material.

8. Device according to claim 7, wherein the gas discharge ring further comprises a body constructed in one piece.

9. Device according to claim 7, wherein the gas discharge ring comprises an upper portion based on a ceramic material or coated with a ceramic material and a lower portion.

10. Device according to claim 1, wherein the gas discharge ring comprises at least ten openings which are in communication with the chamber and which are distributed over the circumference of the gas discharge ring so that the vector range of the gas discharge rate has axial symmetry with respect to the vertical axis of the chamber and the flow of the gases is laminar in the envisaged flow range.

11. Device according to claim 1, wherein the gas discharge ring, the upper chamber wall of the chamber and the heating element are coaxial.

12. Device according to claim 1, wherein the heating element comprises a heat-exchange fluid.

13. Device according to claim 1, wherein the heating element comprises an infrared lamp.

14. Device according to claim 1, wherein the heating element comprises an insulated resistor in a housing based on ceramic material.

* * * * *